US006782517B2

(12) United States Patent
Rittman et al.

(10) Patent No.: US 6,782,517 B2
(45) Date of Patent: *Aug. 24, 2004

(54) PHOTOMASK AND INTEGRATED CIRCUIT MANUFACTURED BY AUTOMATICALLY ELIMINATING DESIGN RULE VIOLATIONS DURING CONSTRUCTION OF A MASK LAYOUT BLOCK

(75) Inventors: Dan Rittman, Foster City, CA (US); Micha Oren, Cupertino, CA (US)

(73) Assignee: DuPont Photomasks, Inc., Round Rock, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/180,865

(22) Filed: Jun. 26, 2002

(65) Prior Publication Data

US 2002/0166109 A1 Nov. 7, 2002

Related U.S. Application Data

(63) Continuation-in-part of application No. 09/634,713, filed on Aug. 7, 2000, now abandoned.

(51) Int. Cl.$^7$ .............................................. G06F 17/50
(52) U.S. Cl. ...................... 716/4; 716/2; 716/5; 716/19
(58) Field of Search ............................. 716/4, 5, 2, 19, 716/11, 6, 21

(56) References Cited

U.S. PATENT DOCUMENTS

| | | | |
|---|---|---|---|
| 5,168,001 A | * 12/1992 | Legare et al. ................ | 428/194 |
| 5,536,955 A | * 7/1996 | Ali .............................. | 257/204 |
| 5,781,446 A | 7/1998 | Wu ............................ | 364/489 |
| 6,009,251 A | 12/1999 | Ho et al. ................ | 395/500.06 |
| 6,122,443 A | 9/2000 | Nishikawa ............. | 395/500.09 |

OTHER PUBLICATIONS

Xue et al., "A Net-Oriented Method for Realistic Fault Analysis", Nov. 1993, IEEE/ACM International Conference on Computer-Aided Design,Digest of Technical Papers pp. 78 -83.*
Allan et al., "Efficient Critical Area Algorithms and their Application to Yield Improvement and Test Strategies", Oct. 1994, IEEE International Workshop on Defect and Fault Tolerance in VLSI Systems, Proceedings pp. 88 -96.*
Allan et al., "Critical Area Extraction for Soft Fault Estimation" Feb. 1998, IEEE Transactions on Semiconductor Manufacturing, vol. 11, iss. 1, pp. 146 -154.*
Segal et al., "Predicting Failing Bitmap Signatures for Memory Arrays with Critical Area Analysis", Sep. 1999, IEEE/SEMI Advanced Semiconductor Manufacturing Conference and Workshop, paper pp. 178 -182.*
U.S. Application Ser. No. 10/180,177 entitled "System and Method For Eliminating Design Rule Violations During Construction of a Mask Layout Block," filed by Dan Rittman et al. on Jun. 26, 2002.

* cited by examiner

Primary Examiner—Vuthe Siek
Assistant Examiner—Sun James Lin
(74) Attorney, Agent, or Firm—Baker Botts L.L.P.

(57) ABSTRACT

A photomask and integrated circuit manufactured by eliminating design rule violations during construction of a mask layout block are disclosed. A photomask includes a substrate and a patterned layer formed on at least a portion of the substrate. The patterned layer may be formed using a mask pattern file created by analyzing a selected position for a polygon in a mask layout block, identifying a design rule violation in the mask layout block if the selected position is less than a design rule from a technology file, and automatically preventing the polygon from being placed in the mask layout block at the selected position if the design rule violation is identified.

26 Claims, 4 Drawing Sheets

PHOTOMASK AND INTEGRATED CIRCUIT MANUFACTURED BY AUTOMATICALLY ELIMINATING DESIGN RULE VIOLATIONS DURING CONSTRUCTION OF A MASK LAYOUT BLOCK

RELATED APPLICATIONS

This application is a continuation-in-part of U.S. patent application Ser. No. 09/634,713, filed Aug. 7, 2000 now abandoned and entitled "AUTOMATIC DESIGN RULE VIOLATIONS ELIMINATION, WHILE CONSTRUCTING MASK LAYOUT DATABASE (IC LAYOUT), METHOD AND COMPUTER SOFTWARE."

TECHNICAL FIELD OF THE INVENTION

This invention relates in general to the field of photolithography, and more particularly to photomask and integrated circuit manufactured by automatically eliminating design rule violations during construction of a mask layout block.

BACKGROUND OF THE INVENTION

Over the past several years, the number of transistors in a semiconductor device has increased dramatically. Due to this increase, the time to design and manufacture semiconductor devices has also increased.

A typical semiconductor design process includes numerous steps. Initially, a circuit designer prepares a schematic diagram that includes logical connections between logic elements that together form an integrated circuit. The schematic diagram is then tested to verify that the logic elements and associated logical connections perform a desired function. Once the circuit is verified, the schematic diagram is converted into a mask layout database that includes a series of polygons. The polygons may represent the logic elements and the logical connections contained in the schematic diagram. The mask layout database is then converted into multiple photomasks, also know as masks or reticles, that may be used to image different layers of the integrated circuit on to a semiconductor wafer.

Typically, the mask layout database is created manually by a layout designer or automatically by a synthesis tool. In a 0.13 micron or below manufacturing process, the layout designer or synthesis tool may have to use thousands of design rules to create the mask layout database. The large number of design rules adds complexity to the layout design process because the layout designer may have to memorize or constantly look up the design rules to place polygons in the mask layout database. Since the process may be completely manual, the layout designer may create design rule violations during the construction of the mask layout database. In order to correct the design rule violations, spacing between polygons on the same layer and dimensions of polygons are compared to the design rules included in a technology file for a desired manufacturing process. This comparison may identify design rule violations if the spacing between the polygons or the dimensions of the polygons in the mask layout database is less than the corresponding minimum allowable design rule in the technology file.

Today, any design rule violations in the mask layout database are corrected manually by a layout designer. The layout designer typically finds each violation and manually corrects the violations by moving polygons associated with the violations. During the correction process, the layout designer may create new design rule violations and, therefore, the correction process may be repeated until the mask layout database does not include any design rule violations. The process of iteratively correcting the design rule violations may take several hours or even days to complete and can increase the time needed to design the integrated circuit. The additional time required to complete layout may also delay the production of a photomask set used to fabricate the integrated circuit.

SUMMARY OF THE INVENTION

In accordance with the present invention, the disadvantages and problems associated with eliminating design rule violations on a photomask have been substantially reduced or eliminated. In a particular embodiment, a photomask is formed by using a mask pattern file created by automatically preventing a polygon from being placed in a selected position in a mask layout block if a design rule violation is identified.

In accordance with one embodiment of the present invention, a photomask includes a patterned layer formed on at least a portion of a substrate. The patterned layer may be formed using a mask pattern file that is created by analyzing a selected position of a polygon in a mask layout block and identifying a design rule violation in the mask layout block if the selected position is less than a design rule from a technology file. If the design rule violation is identified, the placement of the polygon at the selected position is automatically prevented.

In accordance with another embodiment of the present invention, an integrated circuit includes a plurality of interconnect layers, including but not limited to n-well, p-well, diffusion, polysilicon and metal, and a plurality of contact layers that provide electrical connections between the respective interconnect layers. The interconnect and contact layers may be formed using a plurality of photomasks that are created by analyzing a selected position of a polygon in a mask layout block and identifying a design rule violation in the mask layout block if the selected position is less than a design rule from a technology file. If the design rule violation is identified, the placement of the polygon at the selected position is automatically prevented.

Important technical advantages of certain embodiments of the present invention include a clean-by-construction (CBC) tool that prevents design rule violations from being created during the construction of a mask layout block. A layout designer may move a cursor on a display device over a polygon in order to select the polygon. The CBC tool highlights an area that may represent a space in the layout block where polygons may be placed without violating any of the design rule constraints contained in a technology file. If the layout designer attempts to move the polygon outside of the highlighted area, the CBC tool prevents the layout designer from placing the polygon in the desired position and automatically places the polygon in a position located inside the highlighted area. The mask layout block, therefore, may be created free of design rule violations.

Another important technical advantage of certain embodiments of the present invention includes a CBC tool that reduces the design time for an integrated circuit. In a typical integrated circuit design process, a design rule check (DRC) tool analyzes a mask layout file for design rule violations and identifies any violations in an output file. A layout designer may use the output file to manually eliminate the identified design rule violations. In contrast, the present invention may eliminate design rule violations from a mask layout block before the mask layout block is converted into a mask layout file. The time needed to complete the design process for the integrated circuit, therefore, may be substantially reduced since the steps of checking the layout with a DRC tool and correcting the identified design rule violations may be eliminated.

All, some, or none of these technical advantages may be present in various embodiments of the present invention. Other technical advantages will be readily apparent to one skilled in the art from the following figures, descriptions, and claims.

BRIEF DESCRIPTION OF THE DRAWINGS

A more complete and thorough understanding of the present embodiments and advantages thereof may be acquired by referring to the following description taken in conjunction with the accompanying drawings, in which like reference numbers indicate like features, and wherein.

DETAILED DESCRIPTION OF THE INVENTION

Preferred embodiments of the invention and its advantages are best understood by reference to FIGS. 1 through 6 of the drawings, like numerals being used for like and corresponding parts of the various drawings.

As the number of transistors on an integrated circuit continues to increase, the design process for the integrated circuit becomes more complex. For example, an increasing number of transistors may require additional layers to form the integrated circuit on a semiconductor wafer. Each layer of the integrated circuit may have one or more design rules that define how polygons on each layer should be placed in a mask layout block for a desired manufacturing process. The number of design rules for the desired manufacturing process, therefore, increases with the number of layers formed on the semiconductor wafer.

A design rule typically defines the minimum or maximum allowable dimension for a feature fabricated on a specific layer of the integrated circuit. For example, an integrated circuit may include, among other layers, a polysilicon layer that forms transistor gates, a metal layer that forms interconnects between the transistors and a contact or via layer that connects the polysilicon layer to the metal layer. Each layer typically has one or more design rules associated with the features in a mask layout file that are formed on the specific layer. The metal layer may include design rules for a minimum allowable spacing between two adjacent metal features, a minimum width of a metal feature and a minimum and/or maximum length of a metal feature. The polysilicon and contact layers may include similar design rules where the minimum or maximum allowable dimensions are unique to that layer.

Figure 1:
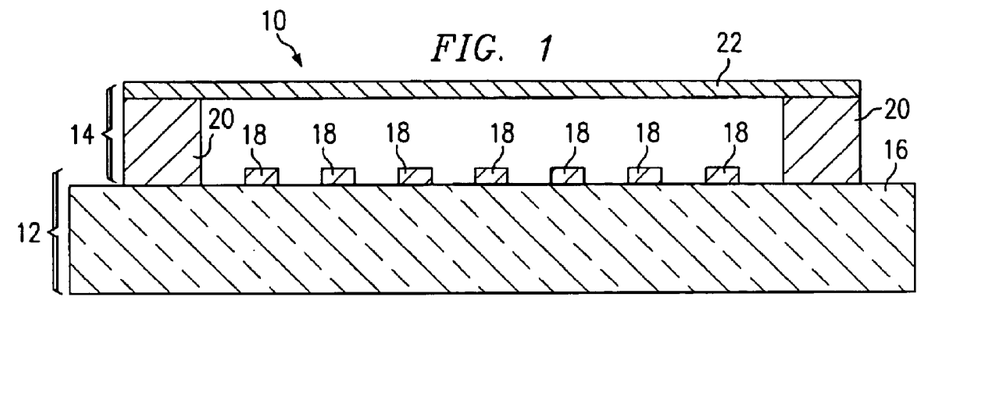
FIG. 1 illustrates a cross-sectional view of a photomask assembly manufactured in accordance with teachings of the present invention.

FIG. 1 illustrates a cross-sectional view of photomask assembly 10 manufactured by converting a mask layout block into one or more a mask pattern files. Photomask assembly 10 includes photomask 12 coupled to pellicle assembly 14. Substrate 16 and patterned layer 18 form photomask 12, otherwise known as a mask or reticle, that may have a variety of sizes and shapes, including but not limited to round, rectangular, or square. Photomask 12 may also be any variety of photomask types, including, but not limited to, a one-time master, a five-inch reticle, a six-inch reticle, a nine-inch reticle or any other appropriately sized reticle that may be used to project an image of a circuit pattern onto a semiconductor wafer. Photomask 12 may further be a binary mask, a phase shift mask (PSM), an optical proximity correction (OPC) mask or any other type of mask suitable for use in a lithography system.

Photomask 12 includes patterned layer 18 formed on substrate 16 that, when exposed to electromagnetic energy in a lithography system, projects a pattern onto a surface of a semiconductor wafer (not expressly shown). Substrate 16 may be a transparent material such as quartz, synthetic quartz, fused silica, magnesium fluoride ($MgF_2$), calcium fluoride ($CaF_2$), or any other suitable material that transmits at least seventy-five percent (75%) of incident light having a wavelength between approximately 10 nanometers (nm) and approximately 450 nm. In an alternative embodiment, substrate 16 may be a reflective material such as silicon or any other suitable material that reflects greater than approximately fifty percent (50%) of incident light having a wavelength between approximately 10 nm and 450 nm.

Patterned layer 18 may be a metal material such as chrome, chromium nitride, a metallic oxy-carbo-nitride (M—O—C—N), where the metal is selected from the group consisting of chromium, cobalt, iron, zinc, molybdenum, niobium, tantalum, titanium, tungsten, aluminum, magnesium and silicon, and any other suitable material that absorbs electromagnetic energy with wavelengths in the ultraviolet (UV) range, deep ultraviolet (DUV) range, vacuum ultraviolet (VUV) range and extreme ultraviolet range (EUV). In an alternative embodiment, patterned layer 18 may be a partially transmissive material, such as molybdenum silicide (MoSi), which has a transmissivity of approximately one percent to approximately thirty percent (30%) in the UV, DUV, VUV and EUV ranges.

Frame 20 and pellicle film 22 may form pellicle assembly 14. Frame 20 is typically formed of anodized aluminum, although it could alternatively be formed of stainless steel, plastic or other suitable materials that do not degrade or outgas when exposed to electromagnetic energy within a lithography system. Pellicle film 22 may be a thin film membrane formed of a material such as nitrocellulose, cellulose acetate, an amorphous fluoropolymer, such as TEFLON® AF manufactured by E. I. du Pont de Nemours and Company or CYTOP® manufactured by Asahi Glass, or another suitable film that is transparent to wavelengths in the V, DUV, EUV and/or VUV ranges. Pellicle film 22 may be prepared by a conventional technique such as spin casting.

Pellicle film 22 protects photomask 12 from dust particles by ensuring that the dust particles remain a defined distance away from photomask 12. This may be especially important in a lithography system. During a lithography process, photomask assembly 10 is exposed to electromagnetic energy produced by a radiant energy source within the photolithography system. The electromagnetic energy may include light of various wavelengths, such as wavelengths approximately between the I-line and G-line of a Mercury arc lamp, or DUV, VUV or EUV light. In operation, pellicle film 22 is designed to allow a large percentage of the electromagnetic energy to pass through it. Dust particles collected on pellicle film 22 will likely be out of focus at the surface of the wafer being processed and, therefore, the exposed image on the wafer should be clear. Pellicle film 22 formed in accordance with the teachings of the present invention may be satisfactorily used with all types of electromagnetic energy and is not limited to lightwaves as described in this application.

Photomask 12 may be formed from a photomask blank using standard lithography processes. In a lithography process, a mask pattern file that includes data for patterned layer 18 may be generated from a mask layout file. The mask layout file may include polygons that represent transistors and electrical connections for an integrated circuit. The polygons in the mask layout file may further represent different layers of the integrated circuit when it is fabricated on a semiconductor wafer. For example, a transistor may be formed on a semiconductor wafer from a diffusion layer and a polysilicon layer. The mask layout file, therefore, may include one or more polygons drawn on the diffusion layer (not expressly shown) and one or more polygons drawn on the polysilicon layer (not expressly shown). The polygons for each layer may be converted into a mask pattern file that represents one layer of the integrated circuit. Each mask pattern file may be used to generate a photomask for the specific layer.

The desired pattern may be imaged into a resist layer of the photomask blank using a laser, electron beam or X-ray lithography tool. In one embodiment, a laser lithography tool uses an Argon-Ion laser that emits light having a wavelength of approximately 364 nanometers (nm). In alternative embodiments, the laser lithography tool uses lasers emitting light at wavelengths from approximately 150 nm to approximately 300 nm. Photomask 12 may be fabricated by developing and etching exposed areas of the resist layer to create a pattern, etching the portions of patterned layer 18 not covered by resist, and removing the undeveloped resist to create patterned layer 18 over transparent substrate 16. Photomask 12 may then be placed into a lithography system to project an image onto the surface of a semiconductor wafer. A separate photomask is used for each individual layer of the integrated circuit. For example, one photomask may be used to create the diffusion regions on a wafer and another photomask may be used to create a layer of polysilicon over the diffusion regions.

Figure 2:
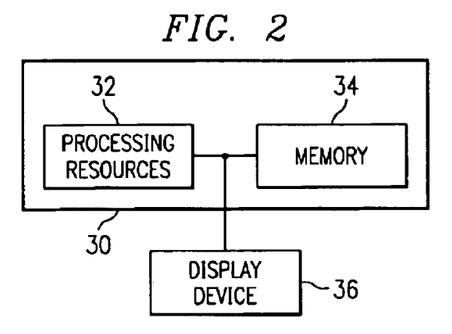
FIG. 2 illustrates a block diagram of a computer system for eliminating design rule violations during construction of a mask layout block formed in accordance with teachings of the present invention.

FIG. 2 illustrates a block diagram of computer system 30 that may be used to eliminate design rule violations during construction of a mask layout block. In the illustrated embodiment, computer system 30 includes processing resource 32, memory 34 and display device 36. Processing resource 32 may be a microprocessor, a microcontroller, a digital signal processor (DSP) or any other digital or analog circuitry configured to execute processing instructions stored in memory 34. Memory 34 may be random access memory (RAM), electrically erasable programmable read-only memory (EEPROM), a PCMCIA card, flash memory, or any suitable selection and/or array of volatile or non-volatile memory that retains data after the power to computer system 30 is turned off. Display device 36 may be a liquid crystal device, cathode ray tube, or other display device suitable for creating graphic images and alphanumeric characters recognizable to a user.

In operation, processing instructions are stored in memory 34. Processing resource 32 accesses memory 34 to retrieve the processing instructions and perform various functions included in the processing instructions. In one embodiment, the processing instructions may include a commercially available layout editor interfaced with a clean-by-construction (CBC) tool. The CBC tool may provide the ability to analyze the placement of a feature in a mask layout block and determine if the placement creates a design rule violation. The CBC tool may be operated in two different modes: a hint mode and an enforce mode. When operating in the hint mode, the CBC tool may graphically display a space where polygons may be placed in the mask layout block without violating any design rules included in a technology file. In the enforce mode, the CBC tool may prevent the placement of polygons in an area of the mask layout block that may create a design rule violation.

When a layout designer creates a mask layout block, the CBC tool reads a technology file corresponding to a desired manufacturing process. The technology file may contain design rules for the desired manufacturing process that ensures an integrated circuit fabricated on a semiconductor wafer functions correctly. Within the mask layout block, the design rules may define the minimum and/or maximum allowable feature dimensions (e.g., spaces between polygons and dimensions of polygons) for the desired manufacturing process. The CBC tool then uses the design rules to prevent the layout designer from creating design rule violations during the construction of the mask layout block.

If the layout designer chooses to operate in hint mode, the layout designer may select a polygon by moving a cursor shown on display device 36 over the desired polygon. The CBC tool uses the design rules to graphically display a space, otherwise known as a hint area, within the mask layout block where the layout designer may move and/or place a polygon without creating a design rule violation. In another embodiment, the CBC tool may display a hint area that represents position in the mask layout block where the placement of a polygon would cause a design rule violation.

The CBC tool may graphically represent the hint area in the mask layout block by highlighting the space with an appropriate color and/or pattern. In one embodiment, the hint area may have a color and/or pattern that is similar to the color and pattern used to represent the layer (e.g., diffusion, polysilicon, metal, etc.) of the polygon being moved or placed in the mask layout block. In another embodiment, the hint area may have a color and/or pattern that is different from the color and pattern of the polygon in order to distinguish the hint area from the polygon.

The layout designer may also choose where the CBC tool displays the hint areas. For example, the CBC tool may only display the hint area for polygons immediately surrounding the polygon being move or placed. In another embodiment, the CBC tool may display hint areas for all polygons within a selected distance from the polygon being placed or moved. In hint mode, the CBC tool may allow the layout designer to place a polygon in any position within the mask layout block. The layout designer, therefore, may create a design rule violation if the polygon is placed in a position that does not comply with the hint area.

However, if the layout designer chooses to operate in enforce mode, the CBC tool may prevent the layout designer from placing a polygon in a position within the mask layout block that will cause a design rule violation. In one embodiment, if the layout designer attempts to place a polygon in a position that does not comply with the hint areas, the CBC tool returns the polygon to its original position or size in the mask layout block. In another embodiment, the CBC tool moves the polygon to the minimum design rule associated with the design layer for the polygon. For example, if the selected polygon is a metal one interconnect line, the CBC tool reads the design rule for minimum spacing between metal one lines and minimum width of a metal one line and moves the polygon from the position selected by the layout designer to the position that is approximately equal to the design rules. In a further embodiment, the CBC tool places the polygon at any position in the mask layout block that complies with the hint areas (e.g., the polygon is inside the hint area if the hint area represents the space where a polygon may be placed without creating a design rule violation or the polygon is outside the hint area if the hint area represents the space where the placement of a polygon would create a design rule violation. The CBC tool, therefore, prevents the layout designer from accidentally creating a design rule violation in the mask layout block. Furthermore, the CBC tool maintains connectivity of any nodes affected by the moved polygon by adding and/or subtracting polygons as necessary.

In another embodiment, the layout designer may select a position in the mask layout block for the polygon or alter the dimensions of the polygon such that the modification does not create a design rule violation. The CBC tool may detect that the dimensions and/or spacing between adjacent polygons are greater than the corresponding minimum design rules contained in the technology file. The CBC tool may provide a highlighted area that represents an area of the mask layout block that may be compacted. In one embodiment, the layout designer may manually move any polygons associated with the highlighted area to the corresponding minimum design rules indicated within the mask layout block on display device 36. In another embodiment, the layout designer may choose to allow the CBC tool to automatically move the associated polygons to the minimum design rules.

In some embodiments, the processing instructions for correcting design rule violations in a mask layout file may be encoded in computer-usable media. Such computer-usable media may include, without limitation, storage media such as floppy disks, hard disks, CD-ROMs, DVDs, read-only memory, and random access memory; as well as communications media such wires, optical fibers, microwaves, radio waves, and other electromagnetic or optical carriers.

Figure 3:
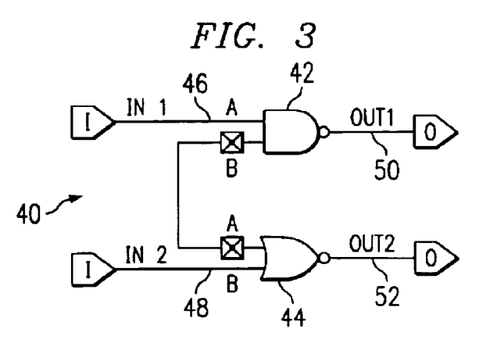
FIG. 3 illustrates a schematic diagram of an example integrated circuit formed in accordance with teachings of the present invention.

FIG. 3 illustrates schematic diagram 40 of an integrated circuit that includes NAND 42 and NOR 44. NAND 42 may include two inputs, labeled a and b and NOR 44 may include two inputs, labeled a and b. In the illustrated embodiment, node 46, labeled in1, is connected to input a of NAND 42, node 48, labeled in2, is connected to input b of NOR 44, and input b of NAND 42 is connected to input a of NOR 44. Output 50 of NAND 22 is labeled out1 and output 52 of NOR 34 is labeled out2. In another embodiment, NAND 42 and NOR 44 may have more than two inputs and the circuit may be connected in any suitable way. In other embodiments, an integrated circuit may include other logical elements, including, but not limited to, inverters, AND gates, OR gates, XOR gates and XNOR gates, and complex circuits, such as adders, latches, flip-flops, multiplexers, registers, memory cells, programmable logic arrays (PLAs) and any other type of circuitry that may be used to form an integrated circuit.

In order to verify that the logic elements and associated connections perform the desired function, a netlist may be generated of the integrated circuit in schematic diagram 40. The netlist may include a list of transistors, such as P-MOSFETS and N-MOSFETS that form the integrated circuit, nodes associated with the integrated circuit (e.g., nodes 26 and 28 and outputs 30 and 32) and the logical connections between the nodes. A verification tool may be used to verify that the connections are correct and the verified netlist may be stored in memory 14 for use by other applications.

Figure 4:
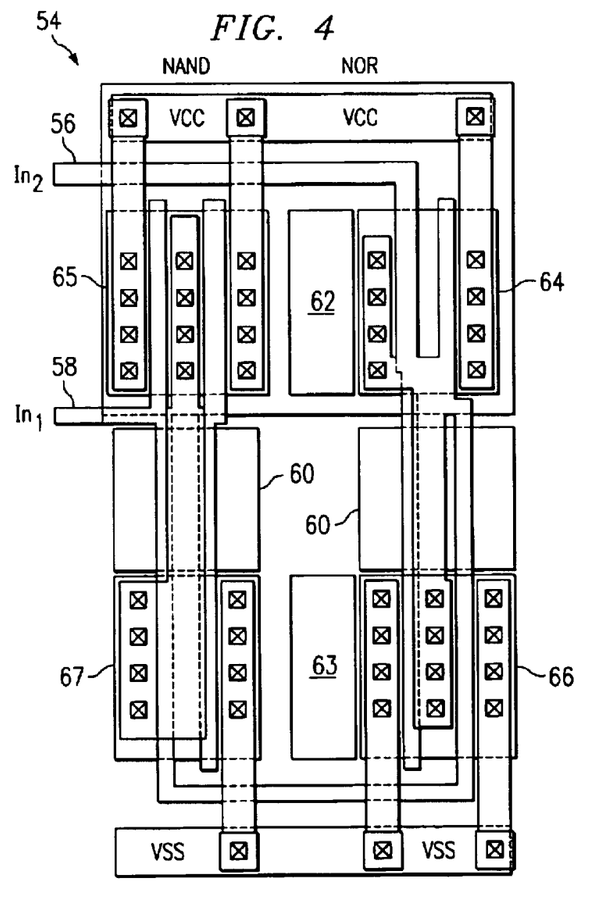
FIG. 4 illustrates a layout view of the example integrated circuit of FIG. 3 that includes a hint area formed in accordance with teachings of the present invention.

FIG. 4 illustrates layout block 54 that represents the integrated circuit shown in schematic diagram 40 of FIG. 3. Layout block 54 includes polygons that form NAND 42 and NOR 44. Node 56 corresponds to node 46 in schematic diagram 40 and node 58 corresponds to node 48 in schematic diagram 40. As shown, the integrated circuit is represented by polygons drawn on different layers, including but not limited to, n-well, p-well, diffusion, polysilicon, metal one contacts, metal one, metal two contacts, and metal two. In another embodiment, the integrated circuit may include the layers shown in FIG. 4 in addition to one or more additional polysilicon layers, one or more additional metal layers and any corresponding contact layers. Each layer may be separated by an insulating material, such as silicon dioxide.

During the construction of layout block 54, a layout designer may decide to place polygons in different positions within layout block 54 and/or move edges of the polygons to increase or decrease the dimensions of the polygons. The placement of polygons in certain positions in layout block 54 may create design rule violations. Since the layout designer may have to memorize over a thousand different design rules, the layout designer may not be able to identify all possible types of design rule violations. The design rule violations, therefore, may be removed by using a design rule check (DRC) tool that compares the dimensions of polygons and the spaces between polygons with design rules included in a technology file for a desired manufacturing process. In order to reduce the time needed to eliminate design rule violations from layout block 54, a clean-by-construction (CBC) tool integrated with a layout editor may use the design rules from the technology file to provide hint areas and prevent the layout designer from placing polygons in positions that may create design rule violations.

As illustrated in FIG. 4, layout block 54 may be designed such that it does not contain the minimum allowable space between polygons or the minimum allowable dimensions for the polygons. The layout designer may decide to move one or more polygons to add features to layout block 54 and/or compact the polygons within layout block 54. When layout block 54 is shown on display screen 36, the layout designer may select a polygon (e.g., p-diffusion region 64) by placing a cursor over the polygon or by placing the cursor over the polygon and pressing a mouse button. If the layout designer chooses to run the CBC tool in hint mode, the CBC tool may provide hint area 62.

In the illustrated embodiment, hint area 62 represents the area within layout block 54 that p-diffusion region 64 may be placed without creating a design rule violation. If any part of p-diffusion region 64 is placed outside of hint area 62 (e.g., between p-diffusion region 65 and hint area 62), a design rule violation may be created. In the hint mode, the CBC tool may allow the layout designer to place a polygon in any position in layout block 54. The layout designer, therefore, may place p-diffusion region 64 outside of hint area 62 and potentially create a design rule violation. This design rule violation may be corrected manually by the layout designer or automatically by an electronic data automation (EDA) tool.

However, if the layout designer chooses to run the CBC tool in enforce mode, the CBC tool may analyze the position of p-diffusion region 64 and prevent the layout designer from placing p-diffusion region 64 outside of hint area 64. For example, the layout designer may attempt to place a portion of p-diffusion region 64 between p-diffusion region 65 and the adjacent edge of hint area 62. The CBC tool may detect that the placement will cause a design rule violation and move p-diffusion region to a position in layout block 54 that does not create a design rule violation. In one embodiment, the CBC tool may move p-diffusion region 64 back to its original position in layout block 54. In another embodiment, the CBC tool may move p-diffusion region 64 to a position that corresponds to the design rule for spacing between p-diffusion regions. In a further embodiment, the CBC tool may place p-diffusion region at any position inside of hint area 62.

In another embodiment, the hint area may be drawn to represent the space in layout block 54 where polygons may not be placed. In this embodiment, the polygon may be placed in any position outside of the hint area. If the CBC tool is operating in enforce mode and detects that the layout designer is attempting to place the polygon inside of the hint area, the CBC tool may return the polygon to its original position, place the polygon adjacent to the hint area such that the polygon is located at a distance approximately equal to the corresponding design rule or place the polygon at any other suitable position outside of the hint area.

Hint area 62 may be highlighted in a color that matches the color and/or pattern used to represent p-diffusion region 64 or any other suitable color and/or pattern that allows the layout designer to identify the hint areas in layout block 54. In a manner similar to the process described above in reference to p-diffusion region 64, the layout designer may select n-diffusion region 66 and the CBC tool may provide hint areas 60 and 63. Hint area 60 may represent the space in layout block 54 where n-diffusion regions 66 and 67 may be positioned and not violate the design rule for spacing between n-diffusion and p-diffusion regions. Hint area 63 may represent the space in layout block 54 where n-diffusion region 66 may be position and not violate the design rule for spacing between n-diffusion regions.

In one embodiment, the layout designer may designate the portion of layout block 54 surrounding a selected polygon in which the CBC tool will provide hint areas 60, 62 and 63. In one embodiment, the CBC tool may provide hint areas in a space directly adjacent to each edge of a selected polygon (e.g., p-diffusion area 64). In another embodiment, the CBC tool may provide hint areas within a selected distance from each edge of the selected polygon.

Figure 5:
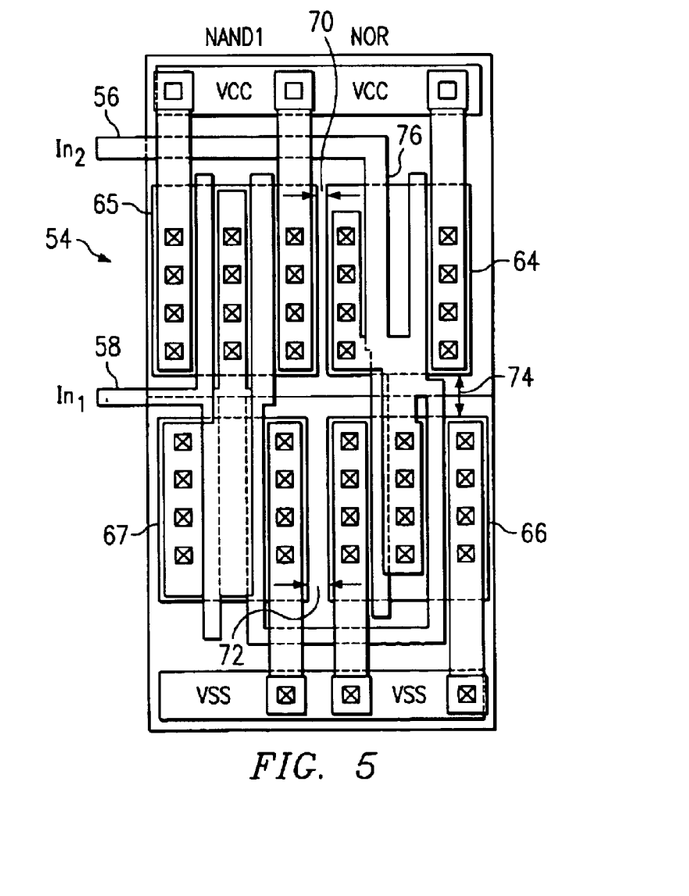
FIG. 5 illustrates a layout view of the example integrated circuit of FIG. 3 after polygons have been placed in the hint area formed in accordance with teachings of the present invention.

FIG. 5 illustrates layout block 54 after polygons have been placed in positions inside of any hint areas provided by the CBC tool. In the illustrated embodiment, the layout designer or the CBC tool has placed p-diffusion region 64 and n-diffusion region 66 such that layout block 54 has the minimum allowable spacing between the polygons. For example, space 70 represents the minimum allowable spacing between p-diffusion region 64 and p-diffusion region 65, space 72 represents the minimum allowable spacing between n-diffusion region 66 and n-diffusion region 67, and space 74 represents the minimum allowable spacing between n-diffusion region 67 and p-diffusion region 65.

In addition to preventing any design rule violations, the CBC tool also maintains the connectivity of electrical connections represented by the polygons in the mask layout file. For example, if the CBC tool or the layout designer moves p-diffusion region 64 towards p-diffusion region 65, the CBC tool must also move polysilicon 76. In order to simultaneously maintain the connectivity of node 56 and move polysilicon 76, the CBC tool may remove polygons in polysilicon 76 in order to compensate for the decreased spacing between p-diffusion region 64 and p-diffusion region 65. The polygons in polysilicon 76 may be removed in order to avoid creating an electrical short between node 56 and any other nodes.

In one embodiment, the CBC tool may analyze layout block 54 to determine if the features in layout block 54 (e.g., the spaces between polygons and the dimensions of the polygons) are greater than the design rules in the technology file. If the CBC tool determines that layout block 54 may be compacted to the minimum design rules, the CBC tool may provide compaction areas. The compaction areas may represent the space in which a selected polygon (e.g., p-diffusion region 64) may be placed such that the distance between the polygons and/or the dimensions of the polygons are approximately equal to the corresponding minimum design rules from the technology file. The compaction areas may have a color and/or pattern that is similar to color and pattern used for the hint areas. In another embodiment, the compaction areas may have a color and/or pattern that is different from the hint areas so that the compaction areas may be distinguished from the hint areas. The hint areas and compaction areas may be displayed simultaneously or separately within layout block 54 on display device 36.

In one embodiment, layout block 54 may be a subcell in a hierarchical design and may be repeated multiple times in a top-level cell. In this example, the CBC tool may provide hint areas in one instance of the subcell. Since each instance of the subcell may include identical polygons, a change to the polygons in one subcell may affect all instances of the subcell. The layout designer and/or CBC tool, therefore, may place polygons in the one subcell and the polygons will be added or moved in all other instances throughout the mask layout block. The change occurs globally such that the layout designer and/or CBC tool does not have to individually change all instances of the subcell. Before the CBC tool provides any hint areas in the one instance of the subcell, the CBC tool may check all instances to verify that placing polygons in a position inside of the hint areas does not create any design rule violations in the top-level cell. Once the CBC tool determines that the polygons in all instances of the subcell may be moved to any position within the hint areas, the CBC tool displays the hint areas in layout block 54 on display device 36.

Figure 6A:
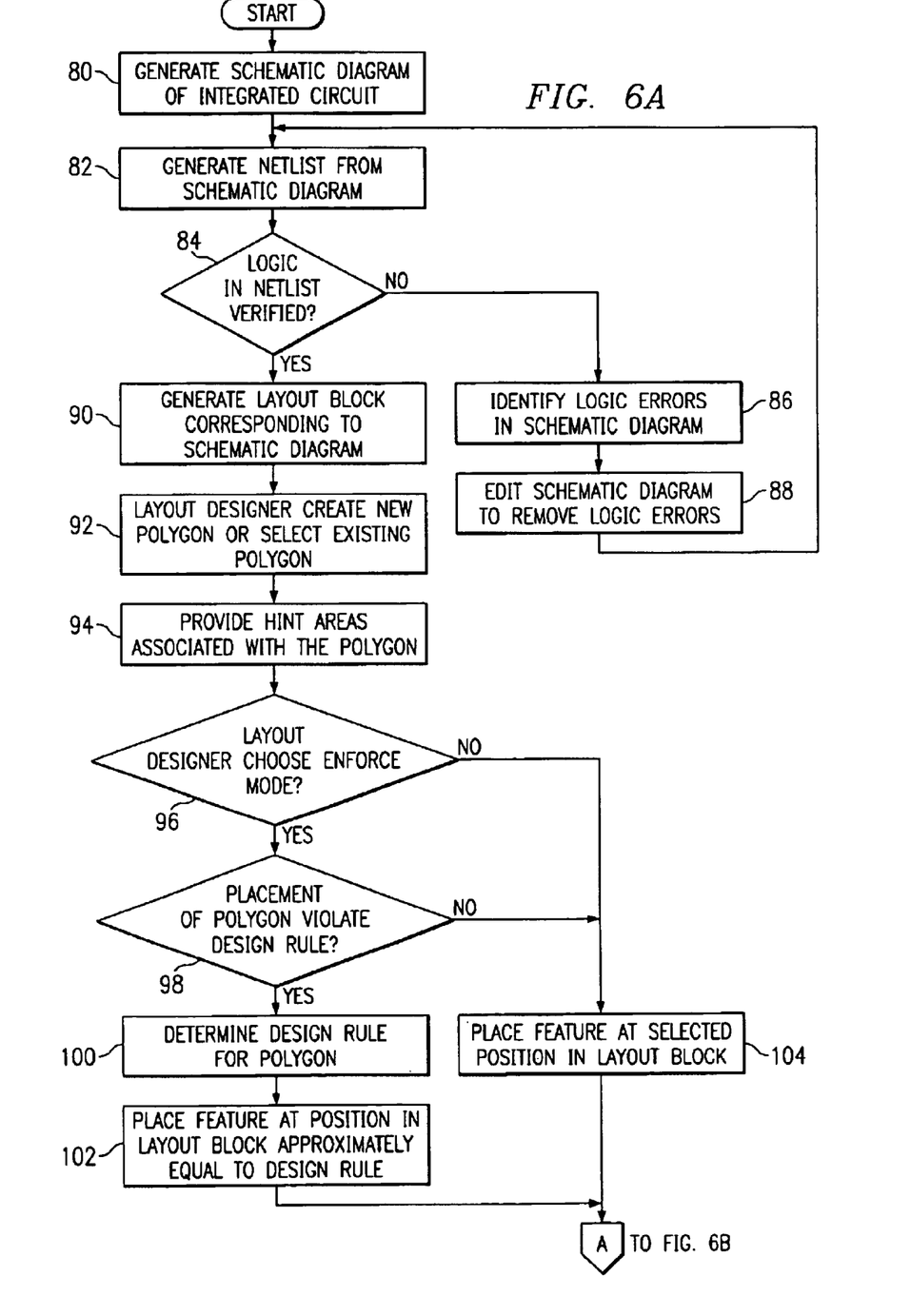
FIGS. 6A and 6B illustrate a flow chart for one example of a method for eliminating design rule violations during construction of a mask layout block in accordance with teachings of the present invention.
Figure 6B:
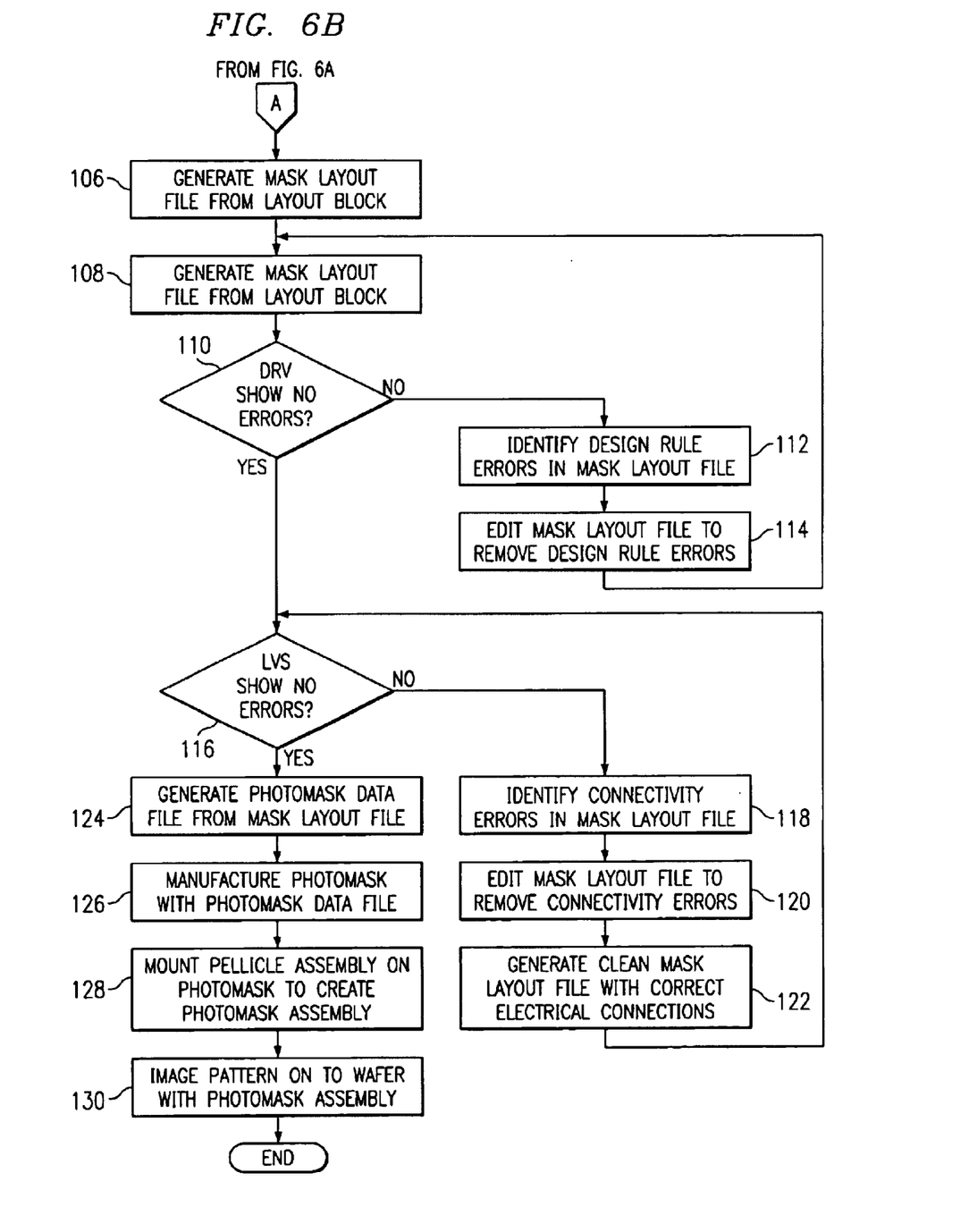

FIGS. 6A and 6B illustrate a flow chart of a method for eliminating design rule violations during construction of a mask layout block. Generally, a clean-by-construction (CBC) tool, which is integrated into a commercially available layout editor, operates in two modes: a hint mode and an enforce mode. In the hint mode, the CBC tool provides a hint area when a layout designer creates a new polygon or selects an existing polygon in the mask layout block. The hint area provides a graphical representation of a space in the mask layout block where a polygon may be placed. When the CBC tool is operating in enforce mode, the CBC tool may provide hint areas and prevent the layout designer from creating a design rule violation. If the CBC tool determines that the selected position (e.g., position of the polygon in the mask layout block and/or the size of the polygon based on the position of the edges) will create a design rule violation, the CBC tool automatically returns the polygon to its original position or places the polygon in a position that does not create a design rule violation. The CBC tool also simultaneously maintains connectivity of any electrical connections that are affected by the placement of the polygon. The CBC tool also provides a compaction area in the mask layout block if the selected position for the polygon creates a space between polygons and/or a dimension of the polygon that is greater than the design rules in the technology file.

At step 80, a circuit designer creates schematic diagram 40 for an integrated circuit. Schematic diagram 40 may be generated manually by the circuit designer or with a synthesis tool that creates a schematic diagram by using an input file, such as a high-level design language (HDL) file. The HDL file may include both behavioral descriptions and structural descriptions for the integrated circuit. Once schematic diagram 40 is complete, a netlist may be generated from schematic diagram 40 at step 82. The netlist may include definitions of the generic cell logic functions and the connections between the various logic functions. In one embodiment, the netlist may be a flat netlist that defines all of the logic and connections at one level. In another embodiment, the netlist may be a hierarchical netlist that contains top-level cells and one or more sub-cells that can be used in any of the top-level cells. The netlist may be generated from CAD tools developed by Cadence, Synopsis, Mentor Graphics or any other company that provides software and/or hardware for generating a netlist from a schematic diagram.

At step 84, the netlist may be tested by a verification tool to determine if schematic diagram 40 includes the correct circuits and logical connections to perform a desired function. If the netlist contains logic errors, the verification tool may generate an output file that contains a list of the logic errors at step 86. The circuit designer may use the output file to correct errors in the logic and/or errors in the connections between the logic in schematic diagram 40 at step 88. The corrections may be made manually by the circuit designer or the output file may be used by a synthesis tool to automatically correct the errors and insert the correct logical elements and/or connections. Once the corrections have been made, a clean netlist is generated for logic verification at step 82.

If the verification tool determines that the netlist does not contain any logic errors, layout block 54 that represents the integrated circuit shown in schematic diagram 40 is created at step 90. Layout block 54 may be created manually by a layout designer using CAD tools developed by Cadence, Synopsis, Mentor Graphics, or any other company that develops integrated circuit (IC) layout tools, or automatically by a synthesis tool. Layout block 54 may include polygons located on different layers that form the transistors and electrical connections for the integrated circuit. The layers in layout block 54 may include, but are not limited to, n-well, p-well, diffusion, one or more polysilicon layers, any suitable number of metal layers and the associated contacts or vias that provide connections between the different layers.

At step 92, a layout designer may attempt to place a polygon at a selected position in layout block 54 by creating a new polygon or selecting an existing polygon. If the CBC tool is running in the hint mode, the CBC tool provides hint areas associated with the polygon being placed in layout block 54 at step 94. In one embodiment, the hint areas may graphically represent a space in layout block 54 where the polygon may be placed without creating a design rule violation. In another embodiment, the hint areas may graphically represent a space in layout block 54 where the polygon may not be placed because a design rule violation would be created. The hint areas may have any color and/or pattern that allows a layout designer to identify the hint areas in layout block 54.

At step 96, the CBC tool determines if the layout designer has selected the enforce mode. If the CBC tool is operating in the hint mode but not the enforce mode, the CBC tool may provide the hint areas but allow the layout designer ignore the hint areas and place a polygon at any position in layout block 54 at step 112. If the CBC tool is operating in the enforce mode, the CBC tool determines if the selected position for the polygon in layout block 54 will create a design rule violation at step 98. If the selected position for the polygon does not create a design rule, the CBC allows the layout designer to place the polygon in the selected position in layout block 54 at step 112.

However, if the selected position violates one or more design rules from the technology file, the CBC tool determines a position in layout block 54 for the polygon by using the design rules from the technology file at step 100. In one embodiment, the CBC tool selects a position in layout block 54 that is approximately equal to the corresponding minimum design rules. In another embodiment, the CBC tool selects a position in layout block 54 that is greater than the corresponding minimum design rules. In a further embodiment, the CBC tool returns the polygon to its original position in layout block 54. At step 102, the CBC tool places the polygon in the position that will not create a design rule violation. In one embodiment, the CBC tool may place the polygon on a layer other than the layer selected by the layout designer in order to avoid creating a design rule violation. For example, the layout designer may want to place a polygon on a specific layer. The CBC tool may analyze the selected position and determine that the polygon cannot be placed on the selected layer without creating a design rule violation. The CBC tool may determine that the polygon may be placed on another layer and provide hint areas for the placement of the polygon on the new layer.

During placement of the polygons, the CBC tool may also maintain connectivity for the electrical connections and compact the features (e.g., spaces between polygons and dimensions of polygons) in layout block 54. When the layout designer moves a polygon to a new position in layout block 54, the CBC tool determines if polygons should be added or removed in order to maintain the correct connectivity for the node being modified. The addition of new polygons and the increase in distance between certain polygons may cause the size of layout block 54 to increase. The CBC tool may also reduce the size of layout block 54 by compacting the layout so that the spacing between the polygons on the same or different layers is approximately equal to the minimum spacing allowed for a specific manufacturing process. Since the compaction process uses design rules from the technology file, no design rule violations are introduced into the mask layout file.

When layout block 54 is complete, a mask layout file is generated at step 108. The mask layout file contains data regarding the geometry and interconnections of the integrated circuit represented in layout block 54. This data may be stored in the GDSII format, CIF format, DFII format, or any other suitable format for data that may describe the geometry and interconnections of integrated circuits. Similar to the schematic netlist, the mask layout file may be flat or hierarchical. In a hierarchical design, a top-level structure includes specific references to one or more levels of sub-cells. The references include all geometry and connectivity information that are contained within each of the subcells. Any top level structures and the associated subcells may also include local geometry and connectivity information that represent circuitry that is logically situated within the top level structure but not included in any referenced subcell.

Once the mask layout file has been generated, a design rule check (DRC) tool determines if layout block 54 contains any design rule violations at step 110. A design rule violation may include, but is not limited to, less than minimum spacing between the same or different layers in layout block 54, less than minimum width of the polygons for the various layers and less than minimum size for a contact. If a design rule violation is identified, the DRC tool includes the violation in an output file at step 112. In one embodiment, the output file may be used by a CAD tool, such as the layout editor integrated with the CBC tool, executing on computer system 30 and the errors may be displayed for a layout designer within layout block 54 on display device 36. At step 114, the violations are corrected in the mask layout file by using the output file. In one embodiment, a layout designer may manually correct the design rule errors within layout 54 based on identifying marks provided by the layout editor. In this example, the layout designer may click on an error listed in the output file to load the error into the layout editor. In another embodiment, the DRC tool may automatically correct the design rule errors in the mask layout file by using the output file and a technology file that contains design rules for a desired manufacturing process.

Once the design rule violations have been removed from the layout block, a clean mask layout file is generated at step 108. The clean mask layout file may be free of design rule violations and may include the minimum spacing between polygons and minimum widths for polygons for a specific semiconductor manufacturing process. The clean mask layout file is then checked by the DRC tool to verify that the design rule violations have been eliminated at step 110. In one embodiment, the DRC tool may incrementally check the spacing between polygons and feature dimensions in the mask layout file such that the DRC tool only checks the portions of the mask layout file that were changed.

If no design rule violations are found, a layout versus schematic (LVS) tool is used to determine if there are any connectivity mismatches between the netlist and the mask layout file at step 116. The LVS tool compares logical connections in the netlist to their corresponding electrical connections in the mask layout file to identify any errors. If the LVS tool determines that connectivity errors are present in the mask layout file, an output file is generated that includes at least one connectivity error at step 118. In one embodiment, a CAD tool, such as the layout editor, executing on computer system 30 reads the output file and displays the connectivity errors for the layout designer within layout block 54 on display device 36.

At step 120, the connectivity errors may be removed from the mask layout file by using the output file. In one embodiment, a layout designer may manually correct the connectivity errors within layout block 54 based on identifying marks provided by a layout editor. In this example, the layout designer may click on an error listed in the output file to load the error into the layout editor. In another embodiment, the LVS tool may automatically correct the connectivity errors in the mask layout file by using the output file. In this example, the LVS tool may remove all polygons associated with a mismatched electrical connection from the mask layout file or create a break point in the mismatched connection and remove all polygons associated with the mismatched connection between the break point and the mismatched node. Once the polygons have been removed, the LVS tool may locate the correct node in the mask layout file and determine a routing path for the matching electrical connection. The LVS tool routes the matching electrical connection in any appropriate layer (e.g., polysilicon and/or any suitable layer of metal) within the mask layout file.

Once all connectivity errors have been removed from the mask layout file, a clean mask layout file is generated at step 122. If the LVS tool determines that the mask layout file does not include any connectivity errors, a photomask data file is generated from the mask layout file at step 124. Multiple photomask data files may be generated to represent the different layers in layout block 54. For example, one photomask data file may contain information for a photomask to be used during the diffusion step of the manufacturing process and a separate photomask data file may contain information for a photomask to be used to form the polysilicon gates of an integrated circuit. At step 126, each of the photomask data files is used in a lithography tool to create a photomask for each layer of an integrated circuit. At step 128, a pellicle assembly may be mounted on the photomask to create a photomask assembly. The pellicle assembly may prevent contaminants from landing on the surface of the photomask. Once the photomask assembly is created, the photomask assembly may be used in a lithography system to image the pattern from the photomask on to a semiconductor wafer at step 130. A different photomask may be used for each layer of the integrated circuit until all layers of the integrated circuit have been fabricated on a semiconductor wafer. In one embodiment, a typical integrated circuit may be fabricated by using between approximately ten and approximately thirty photomasks.

Although the present invention has been described with respect to a specific preferred embodiment thereof, various changes and modifications may be suggested to one skilled in the art and it is intended that the present invention encompass such changes and modifications fall within the scope of the appended claims.

What is claimed is:

1. A photomask, comprising:
  a substrate; and
  a patterned layer formed on at least a portion of the substrate, the patterned layer formed using a mask pattern file created by:
    analyzing a selected position of a polygon in a mask layout block;
    providing a hint area associated with the polygon;
    determining if the selected position produces a design rule violation in the mask layout block based on a design rule from a technology file; and
    automatically preventing the polygon from being placed in the mask layout at the selected position based on the hint area during construction of the mask layout block if the design rule violation exists.

2. The photomask of claim 1, further comprising the patterned layer formed by automatically placing the polygon in an original position in the mask layout block if the design rule violation exists.

3. The photomask of claim 1, further comprising the patterned layer formed by automatically adjusting the selected position until the design rule violation is eliminated.

4. The photomask of claim 1, further comprising the patterned layer formed by:
  identifying the design rule violation if the selected position for the polygon is located inside of the hint area.

5. The photomask of claim 1, further comprising the patterned layer formed by:

identifying the design rule violation if the selected position for the polygon is located outside of the hint area.

6. The photomask of claim 1, further comprising the patterned layer formed by:
   determining if the selected position creates a feature dimension in the mask layout block greater than the design rule; and
   modifying the selected position until the feature dimension is approximately equal to the design rule.

7. The photomask of claim 1, further comprising the patterned layer formed by:
   generating a mask layout file from the mask layout block that does not include the design rule violation; and
   generating the mask pattern file from the mask layout file.

8. The photomask of claim 1, further comprising the design rule selected from a group consisting of an n-well spacing, a p-well spacing, a diffusion spacing, a polysilicon spacing, a metal spacing and a contact spacing.

9. The photomask of claim 1, further comprising the design rule selected from a group consisting of an n-well width, a p-well width, a diffusion width, a polysilicon width, a metal width and a contact width.

10. The photomask of claim 1, wherein the selected position for the polygon comprises a location for the polygon in the mask layout block.

11. The photomask of claim 1, wherein the selected position for the polygon comprises a location for edges of the polygon in the mask layout block.

12. The photomask of claim 1, further comprising the patterned layer formed by:
   determining if the selected position produces a design rule violation in one or more instances of a subcell in the mask layout block, the subcell located in a top-level cell; and
   simultaneously preventing the polygon from being placed in mask layout block at the selected position based on the hint area in each instance of the subcell if the design rule violation exists.

13. A photomask assembly, comprising:
   a pellicle assembly defined in part by a pellicle frame and a pellicle film attached thereto; and
   a photomask coupled to the pellicle assembly opposite from the pellicle film, the photomask including a patterned layer formed on a substrate, the patterned layer formed using a mask pattern file created by:
      analyzing a selected position of a polygon in a mask layout block;
      providing a hint are associated with the polygon;
      determining if the selected position produces a design rule violation in the mask layout block based on a design rule from a technology file; and
      automatically preventing the polygon from being placed at the selected position based on the hint area during construction of the mask layout block if the design rule violation exists.

14. The photomask assembly of claim 13, further comprising the patterned layer formed by automatically placing the polygon in an original position in the mask layout block if the design rule violation exists.

15. The photomask assembly of claim 13, further comprising the patterned layer formed by automatically adjusting the selected position until the design rule violation is eliminated.

16. The photomask assembly of claim 13, further comprising the patterned layer formed by:
   identifying the design rule violation if the selected position for the polygon is located inside of the hint area.

17. The photomask assembly of claim 13, further comprising the patterned layer formed by:
   identifying the design rule violation if the selected position for the polygon is located outside of the hint area.

18. The photomask assembly of claim 13, further comprising the patterned layer formed by providing a compaction area associated with the polygon, the compaction area operable to graphically represent that the selected position creates a feature dimension in the mask layout block greater than the design rule.

19. An integrated circuit formed on a semiconductor wafer, comprising:
   a plurality of interconnect layers selected from the group consisting of n-well, p-well, diffusion, polysilicon and metal; and
   a plurality of contact layers operable to provide electrical connections between the interconnect layers;
   the interconnect and contact layers formed on a semiconductor wafer using a plurality of photomasks created by:
      analyzing a selected position of a polygon in a mask layout block;
      providing a hint area associated with the polygon; and
      determining if the selected position produces a design rule violation in the mask layout block based on a design rule from a technology file; and
      automatically preventing the polygon from being placed at the selected position based on the hint area during construction of the mask layout block if the design rule violation exists.

20. The integrated circuit of claim 19, further comprising the patterned layer formed by automatically placing the polygon in an original position in the mask layout block if the design rule violation exists.

21. The integrated circuit of claim 19, further comprising the patterned layer formed by automatically adjusting the selected position until the design rule violation is eliminated.

22. The integrated circuit of claim 19, further comprising the patterned layer formed by:
   identifying the design rule violation if the selected position for the polygon is located inside of the hint area.

23. The integrated circuit of claim 19, further comprising the patterned layer formed by:
   identifying the design rule violation if the selected position for the polygon is located outside of the hint area.

24. The integrated circuit of claim 19, further comprising the patterned layer formed by:
   determining if the selected position creates a feature dimension in the mask layout block greater than the design rule; and
   modifying the selected position until the feature dimension is approximately equal to the design rule.

25. The integrated circuit of claim 19, further comprising the design rule selected from a group consisting of an n-well spacing, a p-well spacing, a diffusion spacing, a polysilicon spacing, a metal spacing and a contact spacing.

26. The integrated circuit of claim 19, further comprising the design rule selected from a group consisting of an n-well width, a p-well width, a diffusion width, a polysilicon width, a metal width and a contact width.

* * * * *